United States Patent
Ho et al.

(10) Patent No.: US 7,460,035 B1
(45) Date of Patent: Dec. 2, 2008

(54) BALANCED CODE WITH OPPORTUNISTICALLY REDUCED TRANSITIONS

(75) Inventors: Ronald Ho, Mountain View, CA (US); Danny Cohen, Palo Alto, CA (US); Robert J. Drost, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/773,181

(22) Filed: Jul. 3, 2007

(51) Int. Cl.
*H03M 5/00* (2006.01)
(52) U.S. Cl. .......................... 341/58; 341/50
(58) Field of Classification Search ............... 341/58, 341/59, 50; 709/231; 375/240; 370/200, 370/535; 348/462
See application file for complete search history.

(56) References Cited

U.S. PATENT DOCUMENTS 5,974,464 A * 10/1999 Shin et al. ............... 709/231
7,359,437 B2 * 4/2008 Hwang et al. ............... 375/240

\* cited by examiner

*Primary Examiner*—Rexford Barnie
*Assistant Examiner*—Joseph Lauture
(74) *Attorney, Agent, or Firm*—Park, Vaughan & Fleming LLP

(57) ABSTRACT

Embodiments of an encoding circuit to communicate a sequence of words are described. This encoding circuit includes an encoding module that is configured to receive a first sequence of words and to generate a DC-balanced second sequence of words based on the first sequence of words, where communicating the second sequence of words consumes less energy than communicating a third sequence of words that includes words in the first sequence of words alternating with words in the inverse of the first sequence of words. In addition, the second sequence of words includes substantially twice as many words as the first sequence of words.

20 Claims, 5 Drawing Sheets

BALANCED CODE WITH OPPORTUNISTICALLY REDUCED TRANSITIONS

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to techniques for encoding data. More specifically, the present invention relates to a balanced code for transmitting data that opportunistically reduces the number of signal transitions.

2. Related Art

It is often desirable for data sent across a communication path to be DC-balanced. In particular, a communication will be DC-balanced if a number of transmitted logical '1's equals the number of transmitted logical '0's over a predefined interval (such as over a number of bits or clock cycles). The length of this interval depends on the application and can range, for example, from tens to hundreds of bits. Note that if the predefined interval is 40 bits a sequence of 40 transmitted bits must have 20 logical 1s and 20 logical 0s.

As shown in FIG. 1, a commonly used encoding technique that provides DC-balancing is Manchester encoding 100. Under this technique, an encoded bit is represented by a signal transition. For example, a logical 1 may be communicated using a signal transition 110-1 from logical level 112-1 (such as a low signal level) to logical level 112-2 (such as a high signal level). Similarly, a logical 0 may be communicated using a signal transition 110-2 from logical level 112-2 to logical level 112-1. (Note that sometimes the opposite convention is used, in which case a logical 1 is communicated using signal transition 110-2 and logical 0 is communicated using signal transition 110-1.) Consequently, the data bit sequence '000' may be communicated using the encoded sequence '101010,' which includes three cascaded '10' encoded sequences.

Manchester encoding 100 ensures that the encoded sequence is DC-balanced at a very small interval, i.e., two original data bits or four encoded bits. Unfortunately, Manchester encoding 100 has a bandwidth overhead of 100%, which means that every data bit requires two encoded bits. However, in spite of this problem, Manchester encoding 100 is widely used because the circuits for encoding and decoding are very simple and fast. Furthermore, in contrast with other techniques that only guarantee DC-balance over multiple data packets, Manchester encoding 100 guarantees that any given data packet is DC-balanced.

Moreover, Manchester encoding 100 ensures that every encoded bit (such as bits 114) has a signal transition (such as signal transition 110-1 or signal transition 110-2). This property can be used to synchronize a transmitter and a receiver, which is advantageous in systems that require such synchronization. However, in other systems that do not require such synchronization, this guaranteed signal transition may be a problem because it consumes extra power.

One way to view power consumption in VLSI circuits is that energy from a battery or a transformer is used on a chip during the signal transition 110-1 from logical level 112-1 to logical level 112-2 (such as from a low signal level to a high signal level) because such signal transitions drive the voltage of a capacitor with capacitance C up to the chip's power supply voltage Vdd, and this requires energy E which is approximately equal to $CVdd^2$. For example, if we encode a data bit sequence '1111' using Manchester encoding 100, the encoded sequence is '01010101,' which includes four rising signal transitions, and thus, increases power consumption. In contrast, during signal transition 110-2 the voltage stored on the capacitor is simply drained to ground. While this dissipates power, it does not require energy from the power supply.

Note that this description of energy consumption may not apply to all circuits. In particular, if a node is capacitively coupled to the power supply then a downward signal transition (such as the signal transition 110-2) may pull energy from the power supply, and it may be more appropriate to count the total number of signal transitions. Nonetheless, regardless of how the signal transitions are counted the presence of extra signal transitions in the encoded sequence consumes additional power.

In summary, Manchester encoding 100 is a reasonable encoding technique in communication systems that require: simple encoding, per-packet DC-balancing (using guaranteed signal transitions in the encoded bits 114), and/or low-latency. However, this encoding technique has a bandwidth penalty and a power consumption penalty that are prohibitive in many applications.

Hence, what is needed is a method and an apparatus that facilitates DC-balanced encoding without the problems listed above.

SUMMARY

One embodiment of the present invention provides an encoding circuit to communicate a sequence of words. This encoding circuit includes an encoding module that is configured to receive a first sequence of words and to generate a DC-balanced second sequence of words based on the first sequence of words, where communicating the second sequence of words consumes less energy than communicating a third sequence of words that includes words in the first sequence of words alternating with words in the inverse of the first sequence of words. In addition, the second sequence of words includes substantially twice as many words as the first sequence of words.

In some embodiments, a given word in the second sequence includes $2^n$ bits.

In some embodiments, a given word in the first sequence includes between one and four bits.

In some embodiments, the second sequence alternates words from the first sequence with additional words which are determined by the encoding module.

In some embodiments, the words in the first sequence are included in the second sequence as a consecutive block of words. Moreover, the second sequence may begin or end with the consecutive block of words.

In some embodiments, the energy cost is associated with transitions from a first logic level to a second logic level, where the first logic level has a lower value than the second logic level. However, in other embodiments the energy cost is associated with transitions from the second logic level to the first logic level. Furthermore, in additional embodiments the energy cost is associated with transitions from the first logic level to the second logic level and transitions from the second logic level to the first logic level.

In some embodiments, the number of logic-level transitions in the second sequence is less than the number of logic-level transitions in the third sequence.

In some embodiments, the communication includes intra-chip communication and/or inter-chip communication. For example, the communication may include proximity communication between coupled proximity connectors. Furthermore, in some embodiments the communication includes communication over an AC-coupled channel.

In some embodiments, the second sequence is generated using: a look-up table, a state machine, and/or a shift-register sequence.

In some embodiments, the second sequence includes additional words other than words in the first sequence, where the additional words are configured to be ignored by a receiver coupled to the encoding circuit.

Another embodiment of the present invention provides an integrated circuit that includes the encoding module.

Another embodiment of the present invention provides a method for communicating a sequence of words. During this method, a first sequence of words is received. Next, a second sequence of words is generated based on the first sequence of words, where communicating the second sequence of words consumes less energy than communicating a third sequence of words that includes words in the first sequence of words alternating with words in the inverse of the first sequence of words. Furthermore, the second sequence of words includes substantially twice as many words as the first sequence of words, and the second sequence of words is DC-balanced.

Figure 1:
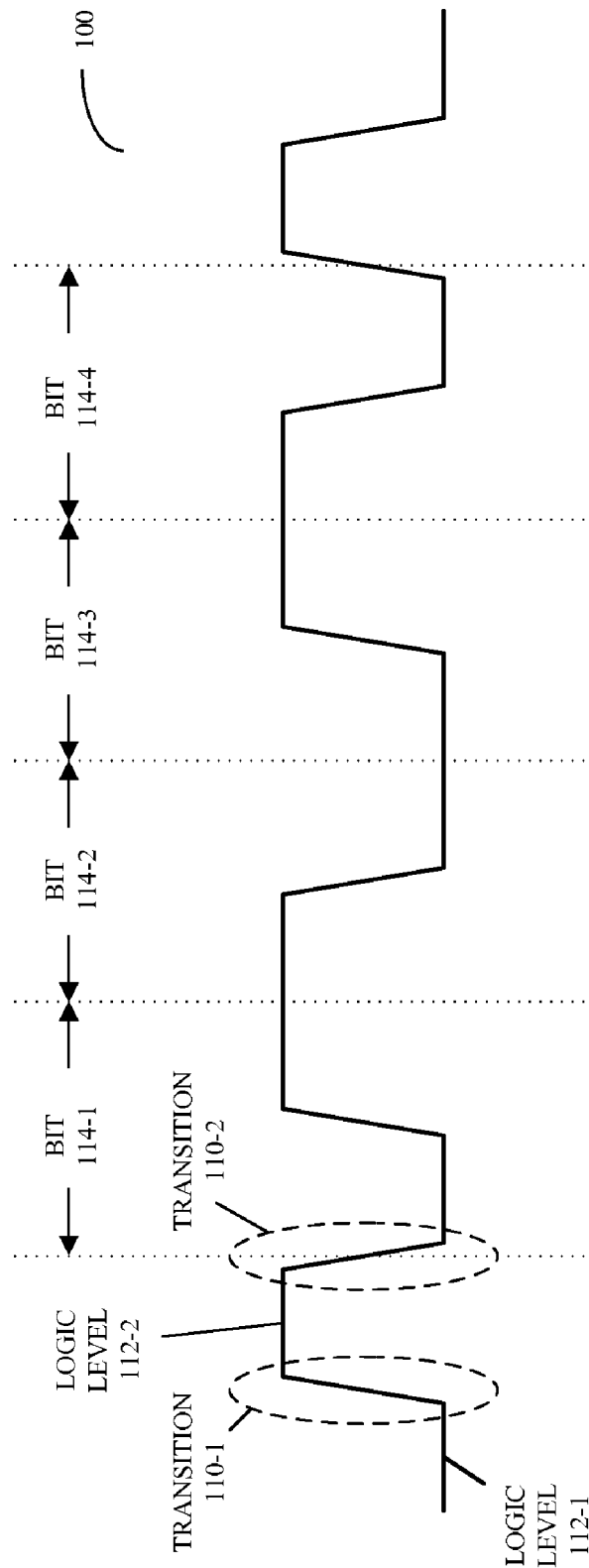
FIG. 1 is a block diagram illustrating an existing Manchester-encoding technique.

Table 1 provides an exemplary encoding technique in accordance with an embodiment of the present invention.

Table 2 provides an exemplary encoding technique in accordance with an embodiment of the present invention.

Table 3 provides an exemplary encoding technique in accordance with an embodiment of the present invention.

Table 4 provides an exemplary encoding technique in accordance with an embodiment of the present invention.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of an encoding method, an encoding circuit, an integrated circuit that includes the encoding circuit, and systems that include the integrated circuit are described. During this method, an initial sequence of words is encoded as a DC-balanced sequence of words, which has substantially twice as many words as the initial sequence of words. Furthermore, the encoded sequence of words reduces an energy cost associated with communication of the initial sequence of words. In particular, the number of signal transitions in the encoded sequence of words may be opportunistically decreased (relative to Manchester encoding) to save energy.

This technique for encoding data may be used in a variety of communications systems, including inter-chip communication and/or intra-chip communication. For example, the encoding technique may be used in: optical communication paths, wireless communication paths, chip-to-chip electrical serial or parallel links (such as links having between one and 64 signal lines), and/or on-chip capacitively-coupled wires. Therefore, the encoding technique may be used in applications, such as: telephony, storage area networks, data centers, networks (such as local area networks), and/or computer systems (such as multi-processor computer systems). Note that the encoding may be implemented in hardware and/or software. Also note that encoding may be applied to: analog signals, digital values (such as binary data), data packets, and/or data streams.

In some embodiments, an encoding circuit that implements the encoding technique is included on a semiconductor die. This semiconductor die may be included in a so-called 'macro chip,' which includes multiple semiconductor dies that communicate with each other using proximity communication. For example, the semiconductor dies may communicate electrical signals using capacitively coupled proximity connectors that are on or proximate to surfaces of the semiconductor dies (which is referred to as capacitively coupled proximity communication). In another example, the semiconductor dies may communicate optical signals using optically coupled proximity connectors that are on or proximate to surfaces of the semiconductor dies (which is referred to as optical proximity communication). Note that in other embodiments magnetically coupled and/or conductively coupled proximity connectors are used.

We now describe embodiments of the encoding circuit and the integrated circuit. Note that in the discussion that follows a word is defined to include one or more bits. For example, a given word in the encoded sequence of words may include $2^n$ bits, where n is an integer.

Figure 2A:
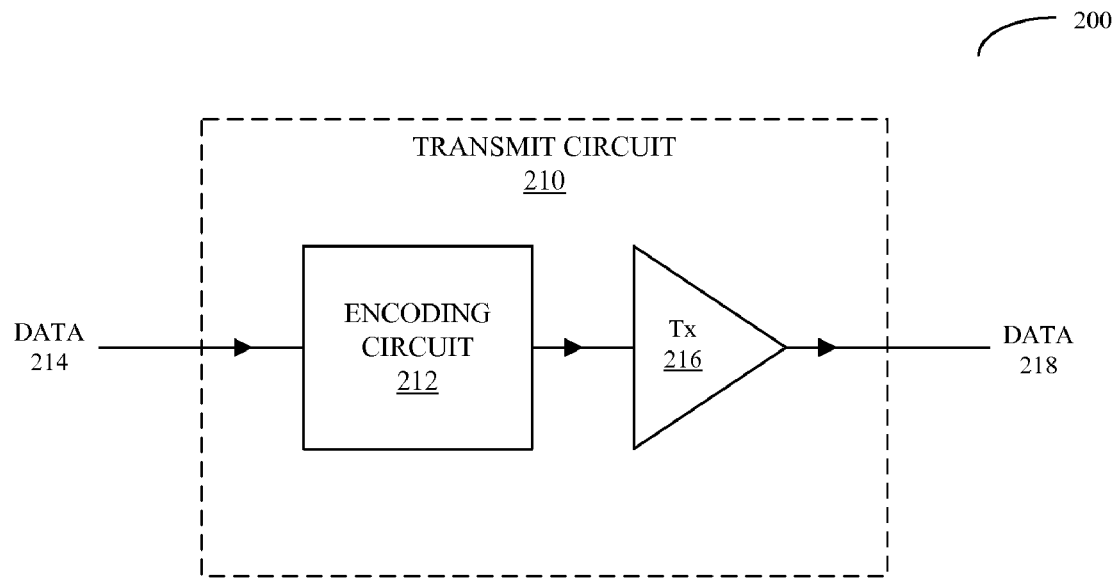
FIG. 2A is a block diagram illustrating a transmit circuit in accordance with an embodiment of the present invention.

FIG. 2A presents a block diagram illustrating an embodiment 200 of a transmit circuit 210. In this circuit, a sequence of words in data 214 is encoded using encoding circuit 212. Then, transmitter Tx 216 outputs data 218 based on an encoded sequence of words received from the encoding circuit 212.

Note that the encoded sequence of words may be DC-balanced. Furthermore, as discussed further below with reference to FIG. 3, the encoding technique implemented by encoding circuit 212 may opportunistically reduce signal transitions in the encoded sequence of words, thereby saving energy and/or reducing power consumption during the transmission of the data 218. For example, relative to Manchester encoding of the data 214, the encoding technique may reduce: the number of rising signal transitions (in which the data 218 transitions from a low logic or signal level to a high logic or signal level), the number of falling signal transitions (in which the data 218 transitions from a high logic or signal level to a low logic or signal level), and/or the total number of signal transitions.

Figure 2B:
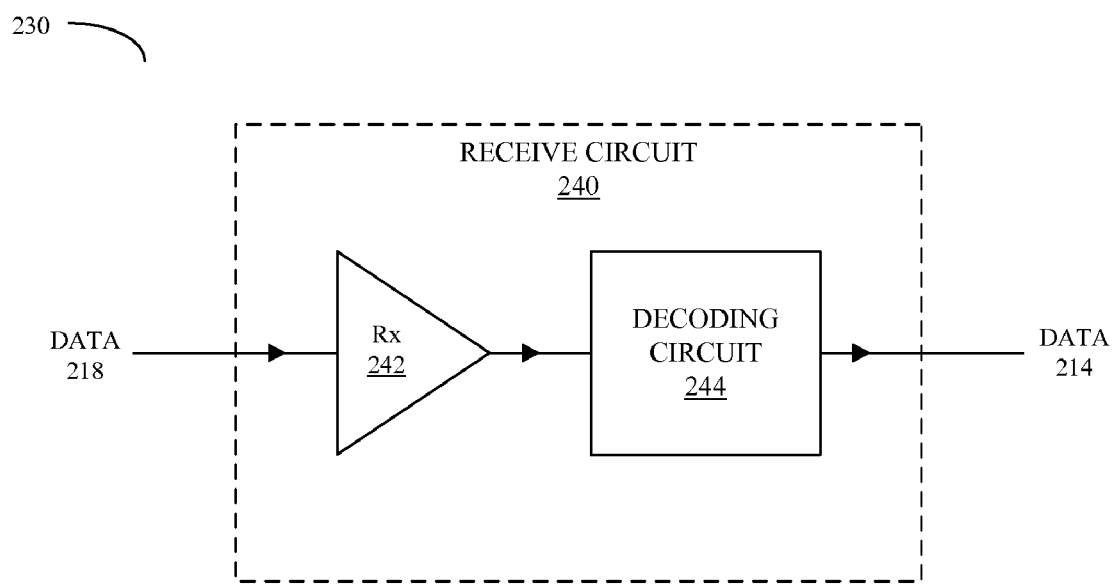
FIG. 2B is a block diagram illustrating a receive circuit in accordance with an embodiment of the present invention.

FIG. 2B presents a block diagram illustrating an embodiment 230 of a receive circuit 240. Note that the receive circuit 240 may be coupled to the transmit circuit 210 via capacitively coupled (or more generally, AC-coupled) on-chip signal lines or wires. Data 218 is received by the receive circuit 240 using receiver Rx 242. Then, an encoded sequence of words is decoded using decoding circuit 244 to generate data 214. Note that during the decoding process the decoding circuit 244 may ignore additional bits or words in the encoded sequence of words, i.e., the receiver Rx 242 may run at half of the rate of the transmitter Tx 216 (FIG. 2A).

Although transmit circuit 210 (FIG. 2A) and receive circuit 240 are illustrated as having a number of discrete components, FIGS. 2A-2B and the other embodiments described below are intended to provide a functional description of the various features which may be present rather than a structural schematic of the embodiments described herein. In practice, and as recognized by those of ordinary skill in the art, the functions of the transmit circuit 210 (FIG. 2A) and receive circuit 240 (as well as the other embodiments) may be distributed over a large number of components performing particular subsets of functions. Therefore, the transmit circuit 210 (FIG. 2A) and receive circuit 240 (as well as the other embodiments) may include fewer components or additional components, two or more components may be combined into a single component, and/or a position of one or more components may be changed. Furthermore, in some embodiments functions of the transmit circuit 210 (FIG. 2A) and receive circuit 240 (as well as the other embodiments) may be implemented in hardware and/or in software.

Figure 3:
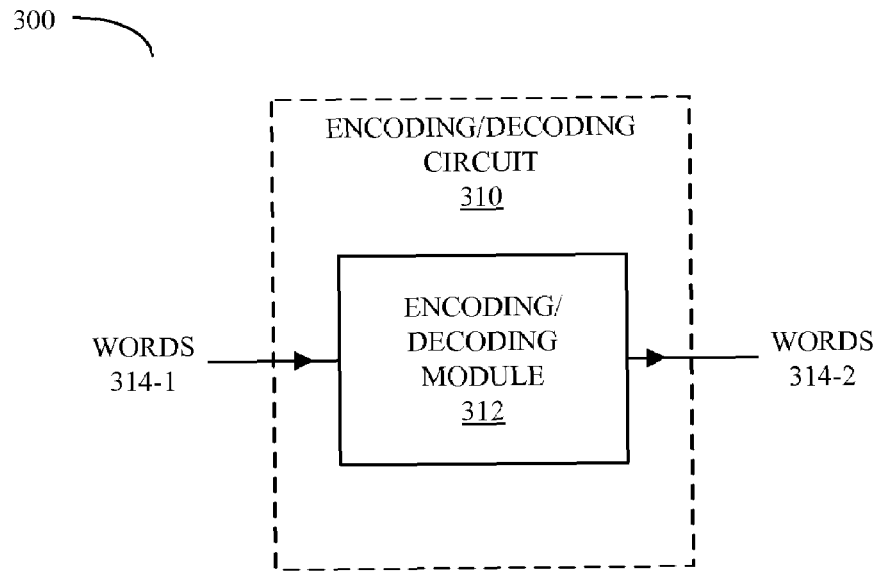
FIG. 3 is a block diagram illustrating an encoding/decoding circuit in accordance with an embodiment of the present invention.

FIG. 3 presents a block diagram illustrating an embodiment 300 of an encoding/decoding circuit 310. In this circuit, encoding/decoding module 312 may encode or decode an input sequence of words 314-1 into an output sequence of words 314-2. In some embodiments, the encoding/decoding module 312 includes: a look-up table (for example, in a content-addressable memory), a state machine, static logic gates, and/or a shift-register sequence.

Figure 4A:
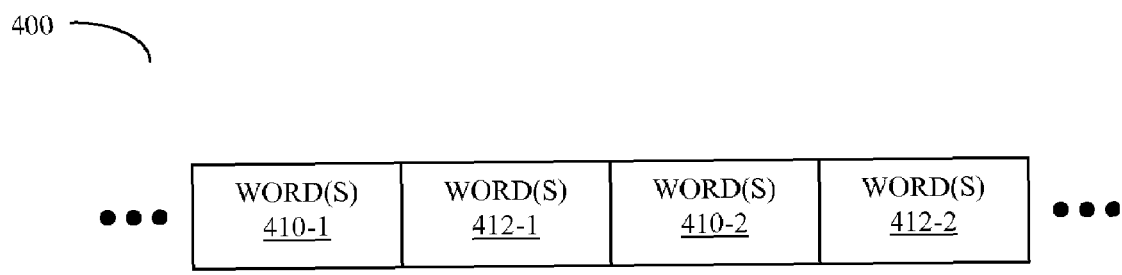
FIG. 4A is a block diagram illustrating a sequence of words in accordance with an embodiment of the present invention.
Figure 4B:
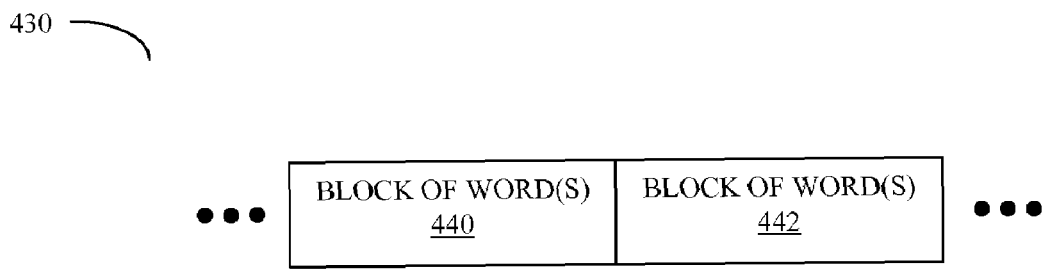
FIG. 4B is a block diagram illustrating a sequence of words in accordance with an embodiment of the present invention.

FIGS. 4A and 4B present block diagrams illustrating embodiments of a sequence of words 400 and 430. Sequence of words 400 alternates words 410 from the initial, un-encoded sequence of words (such as words 314-1 in FIG. 3) with additional words 412 that are determined by encoding/decoding module 312 (FIG. 3). Furthermore, sequence of words 430 includes consecutive blocks of words 440 and 442. For example, block of words 440 may include an un-encoded sequence of words (such as words 314-1 in FIG. 3) and block of words 442 may include additional words 412 that are determined by encoding/decoding module 312 (FIG. 3). Note that in other embodiments the order of the blocks of words is reversed. As discussed below, words in the un-encoded sequence of words may include between one and four bits.

We now discuss exemplary embodiments of the encoding technique. Consider a communication system (such as one that includes transmit circuit 210 in FIG. 2A and receive circuit 240 in FIG. 2B) that uses an embodiment of the encoding technique. Suppose that during this encoding technique an encoding module (such as encoding/decoding module 312 in FIG. 3) examines a current data bit and first transmits the inverse of this data bit. Then, in the next clock period, the encoding module transmits the normal (un-encoded) data bit. After this bit is transmitted, the communication system moves on to the next data bit. Thus, if the communication system is to transmit a logical 1, it first sends a logical 0 and then sends a logical 1.

Next, consider a slight modification to this encoding technique. In particular, decompose a sequence of bits pair wise and examine each pair of bits in turn. For example, in the sequence of bits '000110010110' the pair of bits in the $3^{rd}$ and $4^{th}$ positions from the left has the value '01.' After processing this pair, the encoding technique moves on to process the next two bits ('10') at the $5^{th}$ and $6^{th}$ positions from the left in the sequence of bits.

Furthermore, instead of always blindly transmitting the inverse of a data bit followed by the actual data bit, the encoding technique may encode pairs of data bits (using a so-called 1-bit look-ahead encoding technique). For example, if the two data bits are the same (either '00' or '11') the encoding technique may send the inverted data bit followed by the actual data bit, for each of the two data bits. Thus, a '00' maps to '1010,' which is the same as in Manchester encoding.

However, if the data bits are different, the inverse of the data bits may not be sent. Instead, two copies of the first actual data bit are transmitted, followed by two copies of the second actual data bit. Thus, a '01' maps to '0011' and a '10' maps to '1100.' Note that the logic behind this approach is simple. In particular, the communication system is attempting to DC-balance the data. Consequently, if two successive data bits are opposite then they will already be DC-balanced. Only when two successive data bits are identical will additional signal transitions be added. Said differently, the encoding technique is configured such that a receiver can look at the second bit of any pair of bits (or more generally, words) to determine the actual data. Therefore, by preserving the data in the second bit in any pair of bits and using the first bit in any pair of bits to achieve DC-balance, in some cases this first bit may not be the inverse of the actual data bit.

This encoding technique has a couple of effects. First, the maximum time interval for DC-balancing may be four bits, not two bits as in normal Manchester encoding. However, given that most communication systems can tolerate imbalances over time intervals of tens or hundreds of bits, this change is not a large penalty. In addition, when possible, signal transitions during each bit are eliminated, thereby saving energy and/or reducing power consumption.

Table 1 provides an exemplary embodiment that summarizes the behavior of this encoding technique for the four possible combinations of two data bits. Note that within the four-bit pattern or sequence, transitions from logical 0 to logical 1 correspond to a rising edge (or a rising signal transition), and at the right edge of the pattern a logical 0 counts as one-half of a rising signal transition because the next bit has equal probability of being a logical 0 or a logical 1. Thus, after encoding, the average number of rising signal transitions decreases from 1.5 to 1.25, a 16.6% improvement over Manchester encoding.

TABLE 1

| Data Bits | Manchester Encoding | Rising Signal Transitions | Reduced-Energy Encoding | Rising Signal Transitions |
|---|---|---|---|---|
| 00 | 1010 | 1.5 | 1010 | 1.5 |
| 01 | 1001 | 1.0 | 0011 | 1.0 |
| 10 | 0110 | 1.5 | 1100 | 0.5 |
| 11 | 0101 | 2.0 | 0101 | 2.0 |
| Average | — | 1.5 | — | 1.25 |

Other embodiments of the encoding technique provide additional improvement by slightly modifying the encoding. For example, given a two-bit pair of input data, the communication system may first replicate those data bits on the output and may then output two more bits to achieve DC-balance. For an input data pair of '00,' the balancing bits are '11.' However, for the input data pair '01' the balancing bits may be either '01' or '10.' In this case, the latter may be preferable because it minimizes the number of signal transitions. Similarly, for input data pair '10,' the output '1001' minimizes the number of signal transitions. This encoding technique is summarized in Table 2. Note that this embodiment provides a 33% reduction in the number of rising signal transitions.

TABLE 2

| Data Bits | Manchester Encoding | Rising Signal Transitions | Reduced-Energy Encoding | Rising Signal Transitions |
|---|---|---|---|---|
| 00 | 1010 | 1.5 | 0011 | 1.0 |
| 01 | 1001 | 1.0 | 0110 | 1.5 |
| 10 | 0110 | 1.5 | 1001 | 1.0 |
| 11 | 0101 | 2.0 | 1100 | 0.5 |
| Average | — | 1.5 | — | 1.0 |

Note that in the previous embodiment (summarized in Table 1) the receiver (such as the receiver Rx 242 in FIG. 2B) may only run at half the speed of the data, and thus, may sample every other bit. However, in the embodiment summarized in Table 2 the receiver samples two adjacent bits and may then ignore the next two adjacent bits. For example, the receiver may sample the first and second bits and then ignore the third and fourth bits, or the receiver may sample the first and fourth bits and ignore the second and third bits. Thus, in some embodiments a single receiver that runs at the full data rate is used, and this receiver may be idle during two of the four bit times. Alternatively, two receivers, each running at one-fourth the rate, may be used. In this case, with a group of four bits, one receiver samples the first bit and the other samples the second bit. Then both receivers are idle until the next set of four encoded bits is received.

In other embodiments, the communication uses more than 1-bit look ahead. As summarized in Table 3, in some embodiments the number of rising signal transitions may be reduced by encoding groups of 3 data bits, with an associated penalty in complexity and latency. In this example, the first 3 bits in the output are the three input data bits and the next 3 bits are selected to achieve DC-balance with the minimum number of signal transitions. Note the energy and/or power consumption savings are 44%.

TABLE 3

| Data Bits | Manchester Encoding | Rising Signal Transitions | Reduced-Energy Encoding | Rising Signal Transitions |
|---|---|---|---|---|
| 000 | 101010 | 2.5 | 000111 | 1.0 |
| 001 | 101001 | 2.0 | 001110 | 1.5 |
| 010 | 100110 | 1.5 | 010011 | 2.0 |
| 011 | 100101 | 2.0 | 011100 | 1.5 |
| 100 | 011010 | 2.5 | 100011 | 1.0 |
| 101 | 011001 | 2.0 | 101100 | 1.5 |
| 110 | 010110 | 2.5 | 110001 | 1.0 |
| 111 | 010101 | 3.0 | 111000 | 0.5 |
| Average | — | 2.25 | — | 1.25 |

Table 4 summarizes another embodiment that uses 4-bit look ahead and first outputs those 4 bits. Then, the next 4 bits are selected to achieve DC-balance while minimizing the number of signal transitions. Note that the overall energy and/or power consumption savings is 50%. Also note that as the number of look-ahead bits increases the incremental savings is reduced and the overhead increases.

TABLE 4

| Data Bits | Manchester Encoding | Rising Signal Transitions | Reduced-Energy Encoding | Rising Signal Transitions |
|---|---|---|---|---|
| 0000 | 10101010 | 3.5 | 00001111 | 1.0 |
| 0001 | 10101001 | 3.0 | 00011110 | 1.5 |
| 0010 | 10100110 | 2.5 | 00100111 | 2.0 |
| 0011 | 10100101 | 3.0 | 00111100 | 1.5 |
| 0100 | 10011010 | 2.5 | 01000111 | 2.0 |
| 0101 | 10011001 | 2.0 | 01011100 | 2.5 |
| 0110 | 10010110 | 2.5 | 01100011 | 2.0 |
| 0111 | 10010101 | 3.0 | 01111000 | 1.5 |
| 1000 | 01101010 | 3.5 | 10000111 | 1.0 |
| 1001 | 01101001 | 3 | 10011100 | 1.5 |
| 1010 | 01100110 | 2.5 | 10100011 | 2.0 |
| 1011 | 01100101 | 3.0 | 10111000 | 1.5 |
| 1100 | 01011010 | 3.5 | 11000011 | 1.0 |
| 1101 | 01011001 | 3.0 | 11011000 | 1.5 |
| 1110 | 01010110 | 3.5 | 11100001 | 1.0 |
| 1111 | 01010101 | 4.0 | 11110000 | 0.5 |
| Average | — | 3.0 | — | 1.5 |

Figure 5:
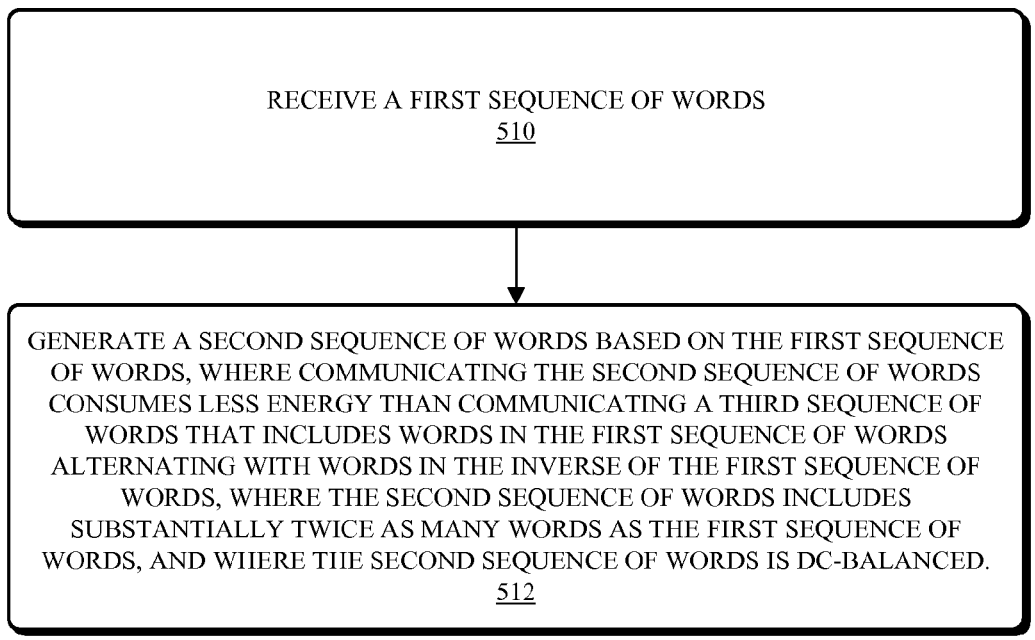
FIG. 5 is a flow chart illustrating a process to communicate a sequence of words in accordance with an embodiment of the present invention.

We now describe embodiments of methods to communicate a sequence of words. FIG. 5 presents a flow chart illustrating an embodiment of a process 500 which communicates a sequence of words. During this method, a first sequence of words is received (510). Next, a second sequence of words is generated based on the first sequence of words (512), where communicating the second sequence of words consumes less energy than communicating a third sequence of words that includes words in the first sequence of words alternating with words in the inverse of the first sequence of words. Furthermore, the second sequence of words includes substantially twice as many words as the first sequence of words, and the second sequence of words is DC-balanced.

In some embodiments of process 500 there may be additional or fewer operations, the order of the operations may be changed, and two or more operations may be combined into a single operation.

Figure 6:
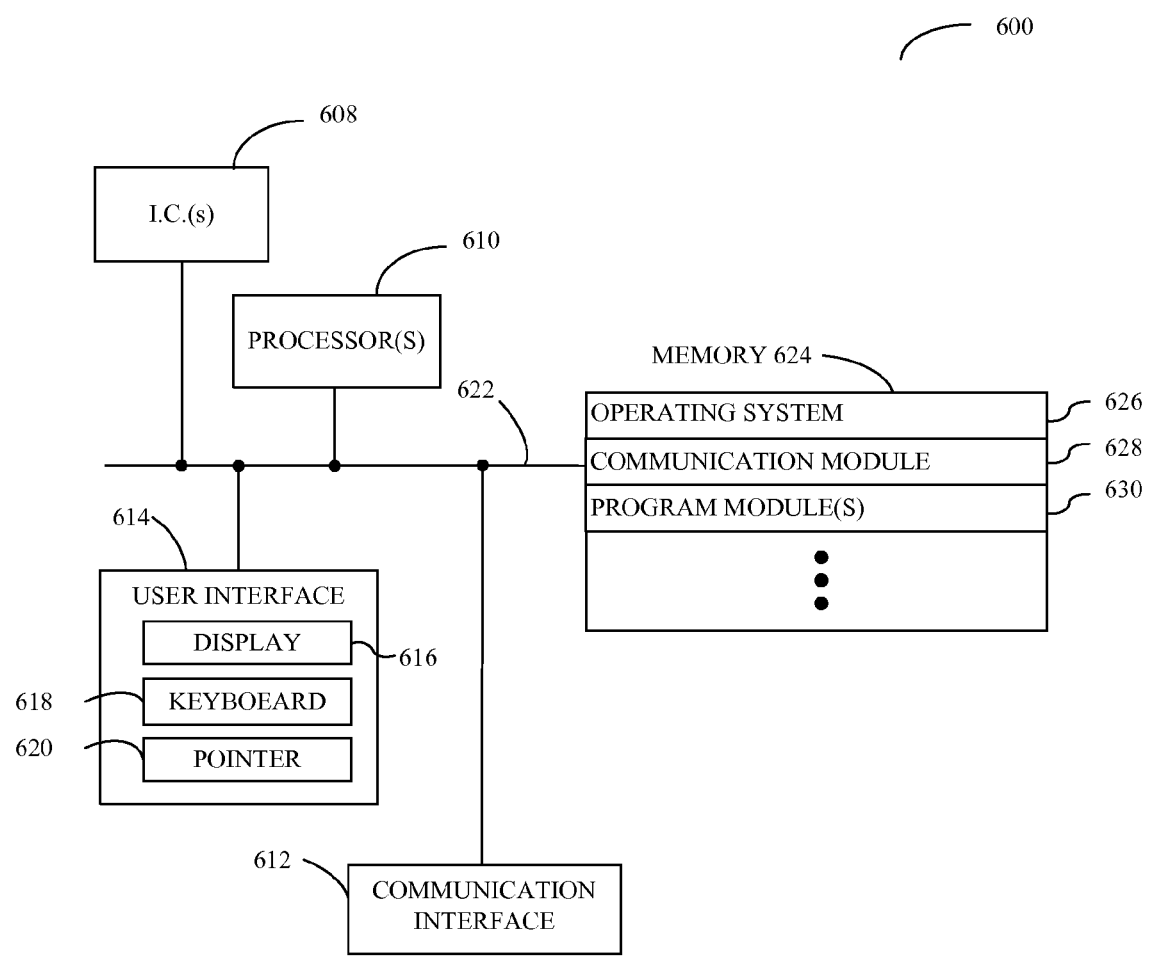
FIG. 6 is a block diagram illustrating a computer system in accordance with an embodiment of the present invention.

Note that the present invention may include systems that contain one or more integrated circuits or semiconductor dies that include circuits that implement the encoding technique (such as during on-chip communication). For example, FIG. 6 presents a block diagram illustrating an embodiment of a computer system 600, which includes one or more processors 610, a communication interface 612, a user interface 614, and one or more signal lines 622 coupling these components together. Note that the one or more processing units 610 may support parallel processing and/or multi-threaded operation, the communication interface 612 may have a persistent communication connection, and the one or more signal lines 622 may constitute a communication bus. Moreover, the user interface 614 may include a display 616, a keyboard 618, and/or a pointer, such as a mouse 620.

Computer system 600 may include memory 624, which may include high speed random access memory and/or non-volatile memory. More specifically, memory 624 may include: ROM, RAM, EPROM, EEPROM, FLASH, one or more smart cards, one or more magnetic disc storage devices, and/or one or more optical storage devices. Memory 624 may store an operating system 626, such as SOLARIS, LINUX, UNIX, OS X, or WINDOWS, that includes procedures (or a set of instructions) for handling various basic system services for performing hardware dependent tasks. Memory 624 may also store procedures (or a set of instructions) in a communication module 628. The communication procedures may be used for communicating with one or more computers and/or servers, including computers and/or servers that are remotely located with respect to the computer system 600.

Memory 624 may also include the one or more program modules (of sets of instructions) 630. Instructions in the program modules 630 in the memory 624 may be implemented in a high-level procedural language, an object-oriented programming language, and/or in an assembly or machine language. The programming language may be compiled or interpreted, i.e., configurable or configured to be executed by the one or more processing units 610.

Computer system 600 may include one or more integrated circuits or I.C.s 608 that include one or more encoding circuits (such as the encoding/decoding circuit 310 in FIG. 3) as described in the previous embodiments.

Computer system 600 may include fewer components or additional components, two or more components may be combined into a single component, and/or a position of one or more components may be changed. In some embodiments, the functionality of the computer system 600 may be implemented more in hardware and less in software, or less in hardware and more in software, as is known in the art.

Although the computer system 600 is illustrated as having a number of discrete items, FIG. 6 is intended to be a functional description of the various features that may be present in the computer system 600 rather than as a structural schematic of the embodiments described herein. In practice, and as recognized by those of ordinary skill in the art, the functions of the computer system 600 may be distributed over a large number of servers or computers, with various groups of the servers or computers performing particular subsets of the functions. In some embodiments, some or all of the functionality of the computer system 600 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An encoding circuit to communicate a sequence of words, comprising an encoding module, wherein the encoding module is configured to receive a first sequence of words and to generate a second sequence of words based on the first sequence of words;

wherein communicating the second sequence of words consumes less energy than communicating a third sequence of words that includes words in the first sequence of words alternating with words in the inverse of the first sequence of words;

wherein the second sequence of words includes substantially twice as many words as the first sequence of words; and wherein the second sequence of words is DC-balanced.

2. The encoding circuit of claim 1, wherein a given word in the second sequence of words includes $2^n$ bits.

3. The encoding circuit of claim 1, wherein a given word in the first sequence of words includes between one and four bits.

4. The encoding circuit of claim 1, wherein the second sequence of words alternates words from the first sequence of words with additional words determined by the encoding module.

5. The encoding circuit of claim 1, wherein the words in the first sequence of words are included in the second sequence of words as a consecutive block of words.

6. The encoding circuit of claim 5, wherein the second sequence of words begins or ends with the consecutive block of words.

7. The encoding circuit of claim 1, wherein the energy cost is associated with transitions from a first logic level to a second logic level, and wherein the first logic level has a lower value than the second logic level.

8. The encoding circuit of claim 1, wherein the energy cost is associated with transitions from a first logic level to a second logic level, and wherein the first logic level has a higher value than the second logic level.

9. The encoding circuit of claim 1, wherein the energy cost is associated with transitions from a first logic level to a second logic level and from the second logic level to the first logic level, and wherein the first logic level has a lower value than the second logic level.

10. The encoding circuit of claim 1, wherein a number of logic-level transitions in the second sequence of words is less than the third sequence of words.

11. The encoding circuit of claim 1, wherein the communication includes intra-chip communication.

12. The encoding circuit of claim 1, wherein the communication includes inter-chip communication.

13. The encoding circuit of claim 1, wherein the communication includes proximity communication between coupled proximity connectors.

14. The encoding circuit of claim 1, wherein the communication includes communication over an AC-coupled channel.

15. The encoding circuit of claim 1, wherein the second sequence of words is generated using a look-up table.

16. The encoding circuit of claim 1, wherein the second sequence of words is generated using a state machine.

17. The encoding circuit of claim 1, wherein the second sequence of words is generated using a shift-register sequence.

18. The encoding circuit of claim 1, wherein the second sequence of words includes additional words other than words in the first sequence of words, and wherein the additional words are configured to be ignored by a receiver coupled to the encoding circuit.

19. An integrated circuit to communicate a sequence of words, comprising an encoding module, wherein the encoding module is configured to receive a first sequence of words and to generate a second sequence of words;

wherein communicating the second sequence of words consumes less energy than communicating a third sequence of words that includes words in the first sequence of words alternating with words in the inverse of the first sequence of words;

wherein the second sequence of words includes substantially twice as many words as the first sequence of words; and wherein the second sequence of words is DC-balanced.

20. A method for communicating a sequence of words, comprising:

receiving a first sequence of words;

generating a second sequence of words based on the first sequence of words, wherein communicating the second sequence of words consumes less energy than communicating a third sequence of words that includes words in the first sequence of words alternating with words in the inverse of the first sequence of words, wherein the second sequence of words includes substantially twice as many words as the first sequence of words, and wherein the second sequence of words is DC-balanced.

* * * * *